United States Patent [19]

Faraguet et al.

[11] 3,737,798

[45] June 5, 1973

[54] VERY HIGH IMPEDANCE INPUT CIRCUIT

[75] Inventors: Claude Faraguet, Clarks Summit, Pa.; Roland Vaillier, 92 Meudon, France

[73] Assignee: Schlumberger Instrument et Systemes, Paris, France

[22] Filed: Mar. 19, 1971

[21] Appl. No.: 126,094

[30] Foreign Application Priority Data

Mar. 20, 1970 France....................7010091

[52] U.S. Cl. ....................330/85, 330/9, 330/99, 330/51

[51] Int. Cl.....................H03f 3/68

[58] Field of Search....................330/9, 85, 26

[56] References Cited

UNITED STATES PATENTS

| | | | |
|---|---|---|---|
| 3,597,696 | 8/1971 | Rabindran | 330/9 X |
| 3,541,320 | 11/1970 | Beall | 330/9 X |
| 3,516,002 | 6/1970 | Hillis | 330/85 X |

*Primary Examiner*—Nathan Kaufman

*Attorney*—William J. Beard, Leonard R. Fellen, Stewart F. Moore, Jerry M. Presson, Edward M. Roney, William R. Sherman and John P. Sinnott

[57] ABSTRACT

Disclosed circuit includes two series-connected operational amplifiers $A_1$ and $A_2$ inverter connected with resistive negative feedback so that their inputs are substantially and at least virtually grounded; a feedback loop including a resistor coupled between the output and input terminals of the series of operational amplifiers for increasing the input impedance of the circuit; and means of controlling stability and of correction comprising, a capacitor C in the feedback loop circuit, and at least one intermittently-operating DC error signal correction circuit.

5 Claims, 4 Drawing Figures

Patented June 5, 1973 3,737,798

3 Sheets-Sheet 1

Patented June 5, 1973

3,737,798

3 Sheets-Sheet 2

VERY HIGH IMPEDANCE INPUT CIRCUIT

The present invention relates to electronic systems possessing a very high input impedance circuit; i.e., a circuit intended to prevent the system's own operation from disturbing the voltage signals delivered by a source to which the system is connected, for measurement purposes for example.

A well-known method of designing amplifier circuits utilizes negative feedback connected operational amplifiers. These amplifiers have a broad passband starting at zero and a very high negative open-loop gain. With a first negative feedback connected resistor and a second resistor connected to the amplifier input upstream of the connection point of the first, the open-loop gain of the amplifier is substantially equal to the ratio of the two resistances. To obtain a high input impedance, this second resistor may be given a very high value. However, one is limited in this regard particularly by the fact that the resistive components used may have an associated stray capacitance effect which is proportional to their resistance values. This is one reason why such operational amplifier circuits do not readily make it possible to obtain very high impedances within a wide frequency band.

It is also conventional to attempt to increase the apparent input impedance of an amplifier circuit of a given gain $g$ and input resistance R by means of a feedback loop comprising in general a resistor and a capacitor connected in parallel between the output of the amplifier circuit and the upstream side of the circuit input resistor. Through a suitable choice of the resistance and capacitance values of the feedback loop components and of the gain of the amplifier, it is possible to maximize the value of the apparent input impedance, which can accordingly reach very high values. However, it had heretofore not appeared possible to devise very high input impedance amplifiers allowing the suitable transmission of AC as well as DC signal voltages. One reason for this is that low drift requirements, essential for reliable DC transmission, and wide passband requirements, are difficult to reconcile. Thus, most of the high impedance input circuits proposed up to the present time to operate from high impedance sources which are not capable of delivering a usable output, and in particular for the analog-to-digital converters used in voltage measurements for example, were altogether different in their design depending on whether or not DC voltage transmission was involved; for DC, in particular, the technique of chopper type amplifiers is most universally used.

One known means of attempting to overcome this difficulty with operational amplifiers is the Goldberg circuit. In this circuit, the applied input signal is highly filtered and its high-frequency component is capacitively coupled to a first input of a differential amplifier, generally provided with a negative feedback, while the low-frequency part of the signal, including the drifts of the differential amplifier, is direct coupled to a modulator, AC-amplifier, demodulator assembly whose output is direct connected to the second input of the differential amplifier. This assembly, which has a negative gain, corrects the output drift of the differential amplifier.

This kind of circuit, however, has various drawbacks, in particular for applications in the field of measurements. Among these drawbacks, are a circuit input impedance which varies according to frequency and which is relatively low for low frequencies, poor transmission of AC series mode voltages and a long DC response time.

In order to overcome the above-mentioned disadvantages, it has been proposed (see, for example, an article by J.R. Jordan, "Positive Feedback Raises Open Loop Gain of Operational Amplifiers" which appeared in the British review *CONTROL*, Volume 11, No. 106, pages 164–167) that an input circuit be used having, as illustrated schematically in FIG. 1, two series-connected operational amplifiers $A_1$ and $A_2$ inverter mounted between two terminals $\alpha$ and $\beta$. A voltage source is shown schematically by a generator Ve and a resistor Re, series-connected between ground and the $\alpha$ terminal. The first operational amplifier $A_1$ is preceded by an input resistor $R_1$ connected downstream of the terminal $\alpha$ to one of its inputs $E_{11}$ having a "−" sign. This input $E_{12}$ of this amplifier, having a "+" sign, is connected to ground across a compensating resistor $R_6$. Between the output $S_1$of the amplifier $A_1$ and its input $E_{11}$, a resistor $R_2$ is negative-feedback connected. The output $S_1$ is also connected, across a resistor $R_3$, to a "−" input $E_{21}$ of the amplifier $A_2$. The other input $E_{22}$ of this amplifier, having a "+" sign, is grounded across the compensating resistor $R_7$. Between the output $S_2$, connected to the terminal $\beta$, and the input $E_{21}$ of the amplifier $A_2$ a resistor $R_4$ is negative-feedback connected. Finally, a positive feedback loop, of resistor $R_5$, marked BR, is connected between the input terminals $\alpha$ and $\beta$ respectively.

As the closed-loop gains of the amplifiers $A_1$ and $A_2$ are respectively $R_2/R_1$ and $R_4/R_3$, the gain $g$ of the equivalent amplifier is $g = R_2/R_1 \cdot R_4/R_3$. It is easily demonstrated that if the condition $g = 1 - R_5/R_1$ is satisfied, the input current of the circuit is zero at all times. it is thus sufficient for the values of the resistors $R_1$, $R_2$, $R_3$, $R_4$ and $R_5$ to be chosen so as to comply, at least in an approximate manner, with the relationship $R_2/R_1/R_4/R_3 = R_5/R_1 + 1$, so that the apparent input resistance of the circuit has an infinite value or, at least, a value sufficiently high so that in no case does the operation of the circuit disturb the signals delivered by the voltage source.

It is immediately apparent that this circuit allows very high apparent input resistances to be obtained with components having relatively low resistances, and whose stray capacitances are consequently also low. The apparent input impedance of the circuit can thus be very high within a very wide passband. However, the mounting of two inverting amplifiers with a negative feedback makes it possible to minimize the influence of their input capacitance, because only a fraction of this capacitance appears at their output. In addition to its very high input impedance and its broad passband, this circuit offers the essential advantage of common-mode rejection at the input. The series connection of the two amplifiers in fact makes it possible, at least virtually, to keep all their inputs at a potential close to zero, so that the circuit can directly admit voltages sometimes as high as several tens of volts without requiring the use of an attenuator which would lower the system's dynamic input range. Finally, it is evident that the absence of filters makes it possible to obtain a practically negligeable DC response time.

Such a circuit however has the disadvantage of not possessing any means of compensating for DC drift, thereby making it unsuitable for use as an input circuit in high performance equipment.

To remedy this shortcoming, the present invention provides a high impedance circuit, of the type described, but whose operating stability is maintained under substantially all circumstances thanks to additional arrangements which are added to the circuit, according to whether it must transmit DC or AC signals.

An object of the invention is to provide a very high impedance circuit, comprising an amplifier of positive gain $g$ and including a first and second operational amplifier, each inverter-connected with a resistive negative feedback and cascade-coupled, so that their inputs are substantially and at least virtually grounded, an input resistor of value $R_1$, one terminal of which is connected to the input of the first operational amplifier, and a resistor of value $R_5$, positive-feedback connected between the output of the second amplifier and the other terminal of the input resistor, the relationship $g=1 + R_5/R_1$ being substantially verified so as to make the apparent input impedance of the amplifier almost infinite. The circuit also comprises, associated with the said operational amplifiers, in combination, a first means of drift stability control including a capacitor C inserted in the loop formed by the two operational amplifiers and the positive-feedback resistor, so as to open the said loop for drift signals having a frequency lower than that of the signals applied at the input, and a second means of drift stability control including at least one circuit made up of a voltage amplifier negative-feedback connected between the output of the second operational amplifier and an input of the first operational amplifier, a switching device designed to isolate this amplifier and operating in opposition with a switching device designed to apply the input signals intermittently, and a storage capacitor one terminal of which is brought to a reference potential and the other terminal of which is connected both to the output of the error voltage amplifier and to the said input of the first operational amplifier, the said first and second means being alternately made inoperative by switches according to whether the input signals are respectively of the DC or AC type.

Thus, when the input circuit has to transmit only pure AC voltages, its operating stability is maintained by the presence of the capacitor C thanks to which the error voltages, which may appear at the terminals of the negative-feedback resistor due to the offset voltages and currents of the first operational amplifier, cannot react, owing to their low frequency, through the said resistor or disturb the transmitted AC signals. When the signals to be transmitted possess a DC component, the operating stability is maintained by the second control means which, during each period that the input is disconnected from the source, detects the error voltage which may appear at the output of the circuit. A compensation voltage is then applied to the first operational amplifier to cancel this error voltage so that the circuit is automatically reset. This compensation voltage is also stored in the storage capacitor and can thus ensure the correction of the input signals during the following active period during which the input is again connected to the source.

Further, in accordance with the invention, the above mentioned second control means may include a circuit which comprises a storage capacitor connected in series between the input switching device and the upstream connection point of the negative-feedback resistor, and a switching device operating in opposition with the said input switching device and connected at an intermediate point between this device and the said storage capacitor. This additional arrangement also ensures the stability of the circuit by performing, outside of the active phases, the detection of error signals which may appear at the input of the circuit. These signals are used to charge the storage capacitor which, at each active phase, corrects the applied input voltage by the detected error voltage.

The invention will be better understood upon consideration of the following description of a particular embodiment of the circuit and with reference to the accompanying drawings in which.

The very high impedance input curcuit according to the invention, as shown in FIG. 2, includes all the elements of the circuit of FIG. 1, and is assigned the same reference numbers, but is characterized by the additional presence of the following elements.

- an input switch $I_e$;
- a capacitor C connected between the output $S_1$ of the amplifier $A_1$ and the resistor $R_3$. This capacitor may be short-circuited by a connection L provided with a switch I;
- an input signal correction circuit CE, delimited by a broken-line frame, and connected between the switch $I_e$ and the terminal $\alpha$;
- an output signal correction circuit CS, delimited by a broken-line frame, and connected between the output $S_2$ of the amplifier $A_2$ and via the resistor $R_6$ to the input $E_{12}$ of the amplifier $A_1$;
- a switch I' connected between ground and the input $E_{12}$ of the amplifier $A_1$.

Figure 2:
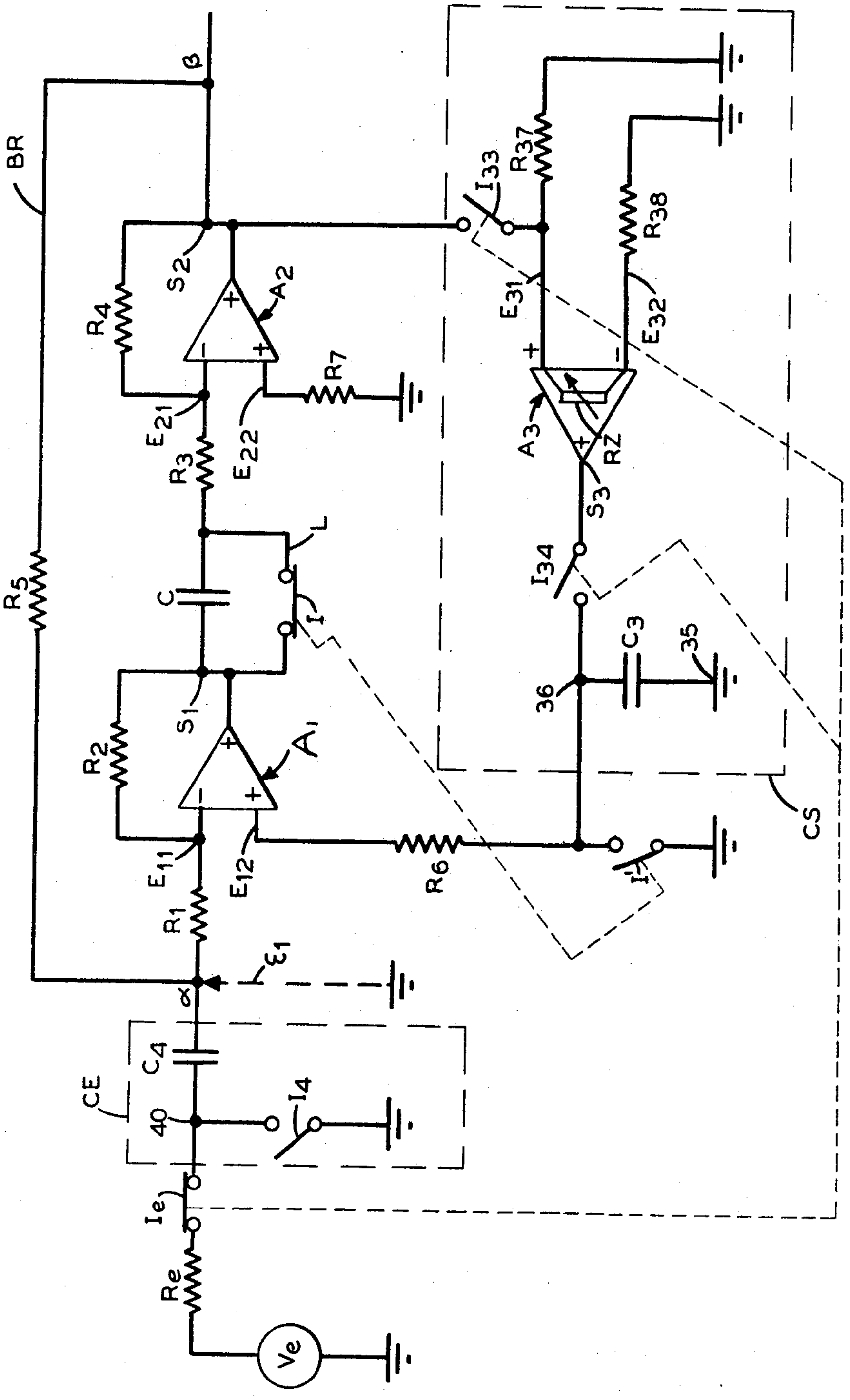
FIG. 2 represents an input circuit according to the invention.
Figure 2A:
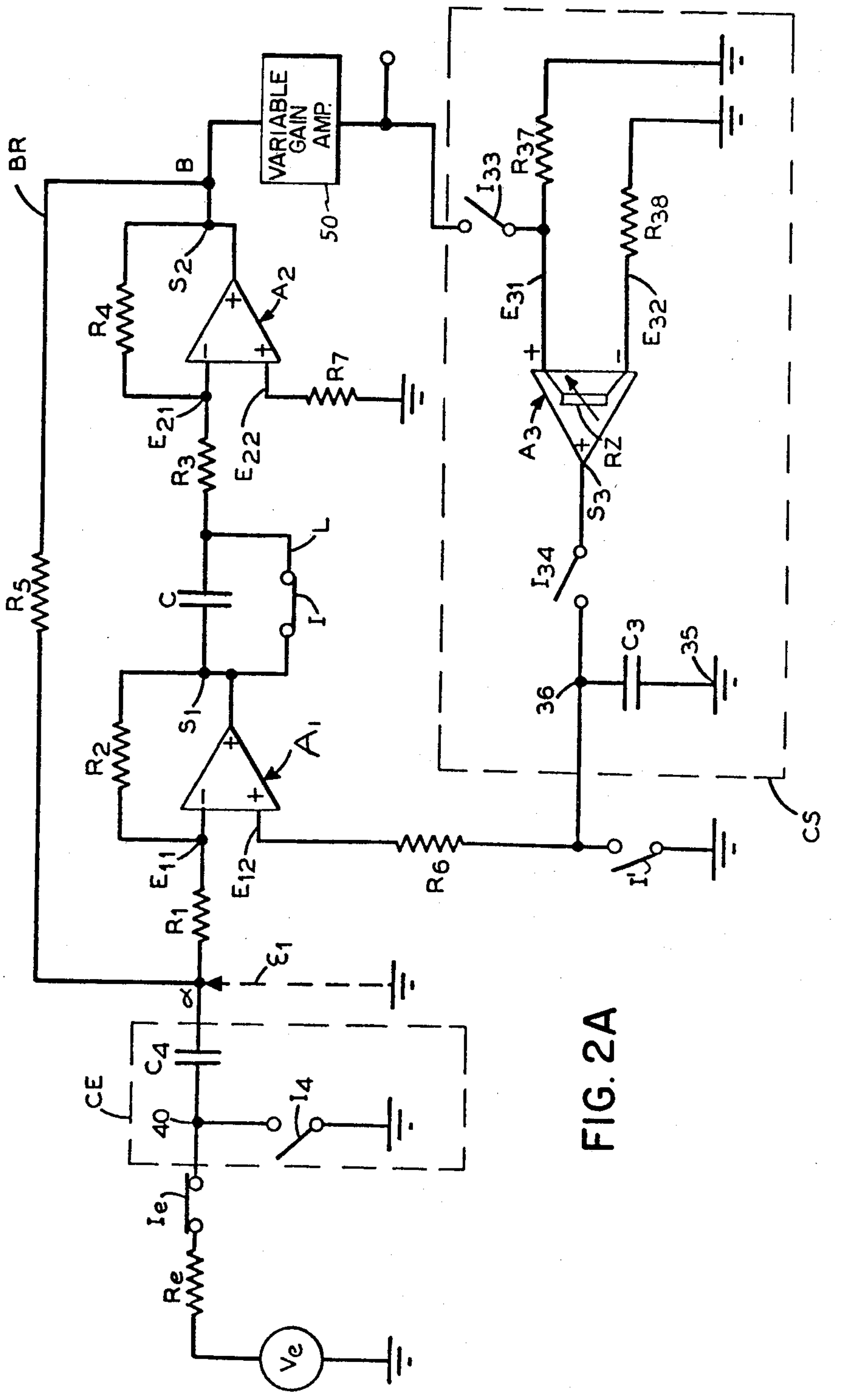
FIG. 2A shows an additional embodiment according to the invention.

In the FIG. 2 circuit, the values of the compensating resistors $R_6$, on the input $E_{12}$ of the amplifier $A_1$, and $R_7$, on the input $E_{22}$ of the amplifier $A_2$, are respectively:

$R_2 (R_1 + R_5)/R_1 + R_2 + R_5$ and $R_3 R_4/R_3 + R_4$ which ensures the best possible balancing of the said inputs.

It is important to note that the relationship $R_2/R_1 \cdot R_4 1 R_3 = R_5/R_1 + 1$ can only be satisfied to within the accuracy and the stability limits of the resistors with respect to time. This relationship is thus written in practice as follows:

$$R_5/R_1 \times 1/g - 1 \quad = 1 \pm 1/K$$

With components of current quality, the value of the coefficient $K$ is of the order of $10^4$. Under these conditions, instead of being infinite, the apparent input resistance of the circuit becomes equal to $(K \pm 1)\, R_1 \cong KR_1$ or $K\, R_5/g - 1$. The apparent input resistance is thus substantially equal to $K$ times the order of magnitude of the resistances of $R_1$ and $R_5$. According to the invention, one uses resistors $R_1$ and $R_5$ of the same value, thereby leading to a gain $g$ equal to 2. For example, with resistances $R_1$ and $R_5$ of 100 kilohms and a coefficient $K$ of the order of $10^4$, the apparent input resistance is equal to 100 Megohms, which is largely sufficient to prevent the operation of the input circuit from disturbing the signals to be transmitted.

When the signal delivered by the source $V_e$, $R_e$ is pure AC, the selector switch $I_e$ and the switch I′ may be left constantly closed and the switch I constantly open; so that the voltage delivered by the source is admitted to the terminal $\alpha$ after having gone without alteration through the error signal correction circuit CE as will be explained below. It has been observed, and this constitutes a valuable aspect of the present input circuit, that the presence of the capacitor C in the circuit loop path was sufficient to assure the stability of its operation.

The capacitor C allows the signal to pass towards $\beta$ while the output signal correction circuit CS remains inoperative as will be explained below. The error voltages which may appear at the terminal $\alpha$ and $\beta$ owing to the offset currents and voltages of the amplifiers $A_1$ and $A_2$ do not, because of their low frequency, react through the loop BR nor disturb the AC signal transmitted through the input circuit. The capacitor C in fact opens the feedback loop between the terminals $\alpha$ and $\beta$ for very low frequencies. The capacitor C could be connected at any other point between $\alpha$ and $\beta$, and for example, downstream of $R_3$, or in series with $R_5$ on the loop BR, provided only that the frequency spectrum of the signal to be transmitted is outside of the range within which this capacitor C opens the loop. Thus, for example, with an AC signal whose lowest frequency is 30 Hertz, the circuit is in open loop for the noises and drifts whose frequency does not exceed 1 Hertz, thanks to the action of the capacitor C of 33 uF and a resistor of 100 KΩ. The circuit remains stable and the transmission of the picked up signal is then excellent. Such an input circuit may be used advantageously with a digital voltmeter.

When the signal to be transmitted has a DC component, it is no longer possible to allow the action of the capacitor C; it is short-circuited by closing the switch I and by opening the switch I′. The correction circuits CS and CE make it possible to carry out the controls and the compensations necessary for the stability of the circuit, in place of the capacitor C, in particular when the input signal handling circuit connected downstream of the system operates in an intermittent manner. An example of such a circuit is a dual-slope digital voltmeter, such as the one described in the French Pat. NO. 1,444,343 filed on June 8, 1965. In DC, this type of voltmeter picks up the input signal only intermittently during a given integration period, following which it is temporarily disconnected from the source, while a reference voltage of opposite sign is used to bring the integrator to the original potential.

The circuits CE and CS perform a detection and a compensation of an error signal during the periods when the input signal is not applied to the input circuit. Two error voltages are thus connected: on the one hand, the error voltage appearing at the output of the input circuit, by means of the output voltage correction circuit CS; and, on the other hand, the error voltage appearing on the terminal $\alpha$, by means of the circuit CE.

The circuit CS is composed essentially of a differential amplifier $A_3$, associated with a capacitor $C_3$. The amplifier $A_3$ is negative feedback connected between the output $S_2$ of the amplifier $A_2$ and the input $E_{12}$ of the amplifier $A_1$. For this purpose, the output $S_2$ of the amplifier $A_2$ is connected to an input $E_{31}$ of the differential amplifier $A_3$ bearing a + sign. A change-over switch $I_{33}$ is inserted on the preceding connection. The input $E_{31}$ is grounded upstream of the connection point 39 of the change-over switch $I_{33}$ across a resistor $R_{37}$. The other input $E_{32}$ of the amplifier $A_3$, having a − sign, is also grounded across a resistor $R_{38}$ equal in value to resistor $R_{37}$. The amplifier $A_3$ is equipped with a zero adjustment device RZ by means of which it is possible to cancel the output voltage $S_3$ at the beginning of utilization when the change-over switch $I_{33}$ is open. The output $S_3$ of the amplifier $A_3$ is connected, via a change-over switch $I_{34}$ and a connecting terminal 36, to a plate of a capacitor $C_3$ whose other plate is grounded at the point 35, and to the input $E_{12}$ of the amplifier $A_1$ through the compensation resistor.

The negative feedback loop in which is situated the amplifier $A_3$ assures compensation for the drifts of amplifiers $A_1$ and $A_2$ even when the input signal is DC. For this purpose, the change-over 33 and $I_{34}$ operate in phase opposition in relation to the input switch $I_e$: when this switch is closed, $I_{33}$ and $I_{34}$ are open, and vice versa. When the input circuit is disconnected in relation to the source, any residual voltage on the terminal $\beta$ is transmitted to the input of the differential amplifier $A_3$ which delivers a compensation voltage and reacts on the input $E_{12}$ of the amplifier $A_1$ so as to cancel the error signal at the output of the circuit or, more precisely, to bring to a value lower than the resolution of this circuit. At the same time, the compensation voltage delivered by the amplifier $A_3$ is stored by the capacitor $C_3$. Thus, the zero of the input circuit is automatically reset during the rest period of the measurement instrument. When $I_e$ is closed, $I_{33}$ and $I_{34}$ open simultaneously under the action of a control device, not shown, thereby isolating the differential amplifier $A_3$ in relation to the input circuit. The compensation voltage stored by the capacitor $C_3$ assures the correction of the input signal during the active phase.

It is to be noted that, if the input circuit is followed by another amplifier, for example a variable gain amplifier 50, it is preferable to connect the input $E_{31}$ of the amplifier $A_3$ to its output in order to correct its drift with respect to time and temperature.

The compensation performed at the level of the input $E_{12}$ of the amplifier $A_1$ by the circuit CS takes into account the drifts of the two amplifiers $A_1$ and $A_2$ but does not prevent the appearance of any error voltage $\epsilon_1$ when the terminal $\alpha$ is disconnected (switch $I_e$ open). This voltage may in particular result from the offset current of $A_1$ flowing in the loop BR, and the role of the circuit CE is to get rid of it.

This circuit is composed essentially of a capacitor $C_4$ connected in series between the change-over switch $I_e$ and the terminal $\alpha$; a change-over switch $I_4$ connected between the upstream terminal 40 of this capacitor $C_4$ and ground, and operating in opposition with $I_e$, forms a series-parallel chopping circuit with $I_e$. These switches, and these of the circuit CS, may consist of field effect transistors, for example. When the switch $I_e$ opens, the terminal $\alpha$ is automatically grounded through $I_4$ via the capacitor $C_4$ which is then charged at the error voltage $\epsilon_1$. When $I_e$ closes, $I_4$ opens and the input voltage $V_e$ is immediately transmitted to the terminal $\alpha$ through the capacitor $C_4$ which corrects $V_e$ by the error voltage $\epsilon_1$ present at $\alpha$; the input current is practically zero. It is noted that the operation of this input circuit does not require the charge of the capacitor $C_4$, and a very short DC response time is thus obtained. Quite the contrary, an attempt is made to prevent the charge of the capacitor $C_4$ from disturbing the value of the voltage admitted at the terminal $\alpha$ of the input circuit. To accomplish this, the capacitance of $C_4$ is calculated as a function of the time $\Delta$ t during which the switch $I_e$ remains closed so that the voltage variation at $\alpha$ is smaller than the resolution of the system. If $\Delta$ V is this resolution, then the previously expressed condition may be written $$\Delta\, t/K\; R_1 \times V_e/C_4 < \Delta V$$

Figure 1:
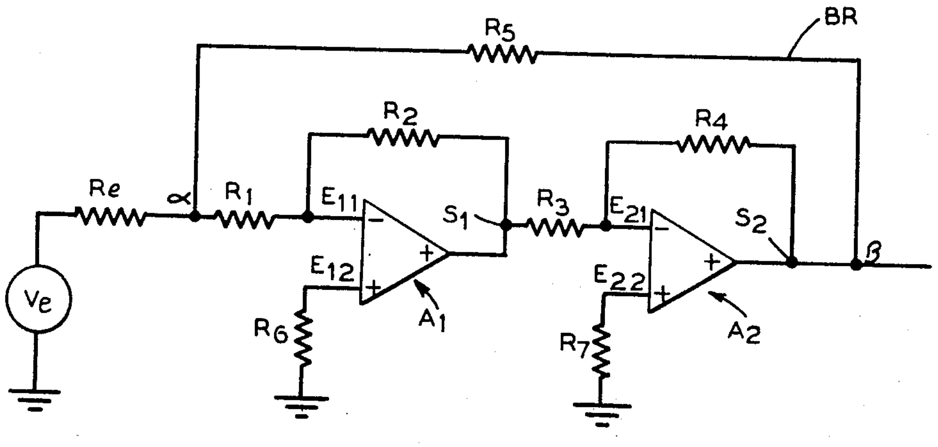
FIG. 1 represents an input circuit according to the prior art, as previously described.
Figure 3:
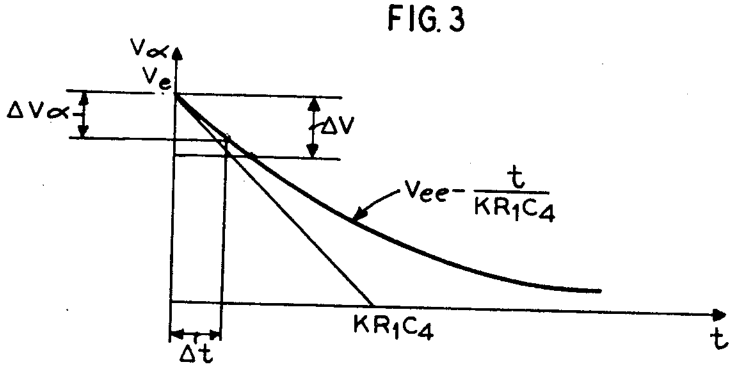
FIG. 3 shows a curve of voltage variation at the input of the first operational amplifier of FIG. 2.

FIG. 3 shows the variation of the voltage $V\alpha$ at the point $\alpha$ as of the instant of closing of $I_e$ as a function of time $t$. The variation $\Delta\ V\alpha$ of the voltage $V\alpha$ during the time $\Delta\ t$ has been indicated on this curve. The chopping time $\Delta\ t$ is related to the operating time of the system located downstream of the circuit. In fact, in order to prevent low level switching during this operating time or measuring time, the switch $I_e$ is controlled such that the input signal is always applied before the beginning of the measuring time, and interrupted when the measuring time has elapsed. However, the above condition is relatively easy to satisfy because the quantity $1/KR_1$ is very small owing to the very high apparent input impedance $KR_1$ of the circuit.

As indicated earlier, the impedance of this circuit is considerable and remains so, as does its gain, within a wide passband. There is no chopping during the measuring period, thus contributing to the quality of the input signal transmission. The signal picked up during the measuring time is not modulated. The series mode AC voltages are transmitted through the circuit. Moreover, the DC response time is very short, in particular compared with prior art input amplifiers having filters with a significant time constant.

Finally, whether for pure AC, or for DC signals, the stability of the circuit is controlled by simple additonal devices which also make it possible to correct the effects of amplifier drift with respect to time and with temperature variations.

With an input circuit in accordance with the preceding principles, an input resistance of 1,000 megohms was obtained with an input capacitance of 20 picofarads between 1 Hertz and 100 Hertz, the transmission of the input voltage being achieved with an accuracy higher than $10^{-3}$. Such input circuits have been embodied in the form of plug-in units used specifically for the transmission of either DC or AC, or, as in the foregoing description, in the form of universal units.

What is claimed is:

1. A very high impedance input circuit, comprising:

an amplifier of positive gain g composed of first and second dual input operational amplifiers, each of said amplifiers being inverter-connected with a resistive negative feedback and said amplifiers being cascade coupled so that their inputs are substantially at virtual ground;

an input resistor of value $R_1$, one terminal of which is connected to one input of the first operational amplifier;

a resistor of value $R_5$ positive-feedback connected between the output of the second operational amplifier and the when input signals are coupled to said first operational amplifier, said voltage amplifier is isolated from said first and second operational amplifiers; and a second storage capacitor one terminal of which is connected to a reference potential and the other terminal of which is coupled to the junction of said means for coupling and said first switching means.

2. An input circuit according to claim 1 wherein said second switching means operates to continuously couple applied AC signals and intermittently couple applied DC signals to the one input of said first operational amplifier. 3. An input circuit according to claim 2 further including, a third capacitor connected in series circuit relationship with said second switching means and said input resistor $R_1$, and a third switching means operating in phase opposition with said second switching means and connected to a point between said second switching means and said capacitor.

4. An input circuit according to claim 3 wherein the capacitance of said second capacitor is determined as a function of the period during which said second switching means provides an input signal coupling path to said input circuit such that the potential variation at the terminals of said second capacitor during this period is lower than the resolution of the system.

5. An input circuit according to claim 1 and further including:

a variable gain amplifier having an input connected to the output of the input circuit and having an output other terminal of the input resistor, so as to establish the relationship $g = 1 + R_5/R_1$ and to make the apparent input impedance of the amplifier practically infinite, the circuit further comprising in association with said operational amplifiers;

a first means of drift stability control including a first capacitor inserted in the loop formed by the two operational amplifiers and the positive feedback resistor for opening said loop for drift signals having a frequency lower than that of signals applied to the input circuit;

a second means of drift stability control including at least one circuit including a negative-feedback voltage amplifier having an input terminal connected to the output of the second operational amplifier;

a first switching means connected to said voltage amplifier for decoupling said voltage amplifier from said first and second operational amplifiers;

means connected to said first switching means for coupling the output of said voltage amplifier to said other input of the first operational amplifier;

a second switching means for coupling input signals to said one input of said first operational amplifier;

means for operating said first and second switching means in phase opposition to one another such that connected to said input of said second means of drift stability control, switching means operative with said first switching means for decoupling said voltage amplifier from said variable gain amplifier, the output of said variable gain amplifier being further connectable to a utilization device.

* * * * *

UNITED STATES PATENT OFFICE

CERTIFICATE OF CORRECTION

Patent No. 3,737,798 Dated June 5, 1974

Inventor(s) Claude Faraguet and Roland Vaillier

It is certified that error appears in the above-identified patent and that said Letters Patent are hereby corrected as shown below:

IN THE SPECIFICATION:

Column 1, line 51, "most" should be -- almost --.

Column 2, line 17, "This input $E_{12}$" should be -- The other input $E_{12}$ --;

line 24, "across the compen-" should be -- across a compen- --;

line 35, "$g = 1 - R_5/R_1$" should be -- $g = 1 + R_5/R_1$ -- .

Column 4, line 32, "connection L provided" should be -- connection conductor L provided --.

Column 6, line 21, "the change-over 33 and $I_{34}$" should be -- the change-over switches $I_{33}$ and $I_{34}$ --.

IN THE CLAIMS:

Claim 1, column 8, line 1, after "the", insert the following:

-- other terminal of the input resistor, so as to establish the relationship $g = 1 + R_5/R_1$ and to make the apparent input impedance of the amplifier practically infinite, the circuit further comprising in association with said operational amplifiers;

FORM PO-1050 (10-69)

USCOMM-DC

U.S. GOVERNMENT PRINTING OFFICE

UNITED STATES PATENT OFFICE

CERTIFICATE OF CORRECTION

Patent No. 3,737,798 Dated June 5, 1974

Inventor(s) Claude Faraguet and Roland Vaillier

It is certified that error appears in the above-identified patent and that said Letters Patent are hereby corrected as shown below:

IN THE CLAIMS (continued from PAGE 1)

a first means of drift stability control including a first capacitor inserted in the loop formed by the two operational amplifiers and the positive feedback resistor for opening said loop for drift signals having a frequency lower than that of signals applied to the input circuit;

a second means of drift stability control including at least one circuit including a negative-feedback voltage amplifier having an input terminal connected to the output of the second operational amplifier;

a first switching means connected to said voltage amplifier for decoupling said voltage amplifier from said first and second operational amplifiers;

means connected to said first switching means for coupling the output of said voltage amplifier to said other input of

USCOMM-DC
U.S. GOVERNMENT PRINTING OFFICE

UNITED STATES PATENT OFFICE
CERTIFICATE OF CORRECTION

Patent No. 3,737,798 Dated June 5, 1974

Inventor(s) Claude Faraguet and Roland Vaillier

It is certified that error appears in the above-identified patent and that said Letters Patent are hereby corrected as shown below:

IN THE CLAIMS (continued from PAGE 2)

the first operation amplifier;

a second switching means for coupling input signals to said one input of said first operational amplifier;

means for operating said first and second switching means in phase opposition to one another such that --

Claim 5, column 8, line 33, after the word "put" delete the following:

[other terminal of the input resistor, so as to establish the relationship $g = 1 + R_5/R_1$ and to make the apparent input impedance of the amplifer practically infinite, the circuit further comprising in association with said operation amplifiers;

a first means of drift stability control including a

CERTIFICATE OF CORRECTION

Patent No. 3,737,798 Dated June 5, 1974

Inventor(s) Claude Faraguet and Roland Vaillier

It is certified that error appears in the above-identified patent and that said Letters Patent are hereby corrected as shown below:

IN THE CLAIMS (continued from PAGE 3)

first capacitor inserted in the loop formed by the two operational amplifiers and the positive feedback resistor for opening said loop for drift signals having a frequency lower than that of signals applied to the input circuit;

a second means of drift stability control including at least one circuit including a negative-feedback voltage amplifier having an input terminal connected to the output of the second operational amplifier; a first switching means connected to said voltage amplifier for decoupling said voltage amplifier from said first and second operational amplifiers;

means connected to said first switching means for coupling the output of said voltage amplifer to said other input of the first operational amplifier;

USCOMM-DC

UNITED STATES PATENT OFFICE

CERTIFICATE OF CORRECTION

Patent No. 3,737,798 Dated June 5, 1974

Inventor(s) Claude Faraguet and Roland Vaillier

It is certified that error appears in the above-identified patent and that said Letters Patent are hereby corrected as shown below:

IN THE CLAIMS (continued from PAGE 4)

a second switching means for coupling input signals to said one input of said first operational amplifier;

means for operating said first and second switching means in phase opposition to one another such that ]

Signed and sealed this 1st day of October 1974.

(SEAL)
Attest:

McCOY M. GIBSON JR.
Attesting Officer

C. MARSHALL DANN
Commissioner of Patents